United States Patent
Iida et al.

[11] Patent Number: 6,053,975
[45] Date of Patent: Apr. 25, 2000

[54] CRYSTAL HOLDING APPARATUS

[75] Inventors: Makoto Iida; Eiichi Iino; Masanori Kimura; Shozo Muraoka, all of Gunma-ken, Japan

[73] Assignee: Shin-Etsu Handotai Co., Ltd., Tokyo, Japan

[21] Appl. No.: 09/039,830

[22] Filed: Mar. 16, 1998

[30] Foreign Application Priority Data

Mar. 17, 1997 [JP] Japan .................................. 9-083322

[51] Int. Cl.⁷ .............................................. C30B 35/00
[52] U.S. Cl. .............................................. 117/218
[58] Field of Search .................... 117/216, 218, 117/221, 911

[56] References Cited

U.S. PATENT DOCUMENTS

| | | | |
|---|---|---|---|
| 4,190,630 | 2/1980 | Apilat et al. | 117/217 |
| 5,126,113 | 6/1992 | Yamagishi et al. | 117/218 |
| 5,196,086 | 3/1993 | Kida et al. | 117/35 |
| 5,843,229 | 12/1998 | Kimura et al. | 117/218 |
| 5,879,449 | 3/1999 | Urang et al. | 117/13 |
| 5,882,397 | 3/1999 | Iino et al. | 117/13 |

FOREIGN PATENT DOCUMENTS

| | | |
|---|---|---|
| 0449260 | 3/1991 | European Pat. Off. |
| 0488785 | 11/1991 | European Pat. Off. |
| 0781875 | 7/1997 | European Pat. Off. |
| 62-288191 | 12/1987 | Japan . |
| 63-252991 | 10/1988 | Japan . |
| 3285893 | 12/1991 | Japan . |
| 3295893 | 12/1991 | Japan . |
| 9002893 | 1/1997 | Japan . |

Primary Examiner—Felisa Hiteshew
Attorney, Agent, or Firm—Loeb & Loeb, LLP

[57] ABSTRACT

In a crystal holding apparatus, a corrugated portion between a seed crystal and a straight cylindrical portion of a monocrystal is held by holding portions of a lifting jig during a monocrystal growth process in which the seed crystal is brought into contact with material melt and is subsequently pulled while being rotated. In the crystal holding apparatus, an attachment member for establishing surface contact with the corrugated portion of the crystal is attached to the tip end of each holding portion of the lifting jig. Therefore, the monocrystal can be held reliably, so that the breaking and falling down of the monocrystal during the pulling operation can be prevented.

8 Claims, 2 Drawing Sheets

CRYSTAL HOLDING APPARATUS

BACKGROUND OF THE INVENTION

1. Field of the Invention

The present invention relates to an improvement on a crystal holding apparatus for holding a corrugated portion of a crystal in a pulling apparatus which pulls the monocrystal according to, for example, the Czochralski method (CZ method).

2. Description of the Related Art

The CZ method has conventionally been used in the manufacture of an ingot of a semiconductor material such as silicon. In the CZ method, a seed crystal held by a seed chuck is brought into contact with the surface of material melt contained in a crucible, and is then pulled while being rotated. At this time, the pulling speed is controlled such that a neck portion is first formed below the seed crystal, and a straight cylindrical monocrystal portion (i.e., ingot) having a large diameter is then formed. The formation of the neck portion permits elimination of dislocations from the straight cylindrical portion, thereby improving the quality of the ingot. In recent years, the weight of a monocrystalline ingot to be pulled has tended to increase due to an increase in the diameter of the monocrystalline ingot and an improvement in manufacturing efficiency, and consequently the strength of the neck has tended to be insufficient.

In view of the foregoing, there has been adopted a technique in which a stepped engagement portion consisting of an increased-diameter portion and a reduced-diameter portion is formed between the neck portion and the straight cylindrical portion of a monocrystal, and the monocrystal is pulled while a lifting jig holds the stepped engagement portion. Examples of such a technique are described in, e.g., Japanese Patent Application Laid-open (kokai) Nos. 62-288191, 63-252991, 63-285893, and 3-295893. For instance, in the apparatus disclosed in Japanese Patent Application Laid-Open No. 3-285893, a stepped engagement portion is formed while a seed crystal is pulled, and when the stepped engagement portion reaches a position corresponding to gripping levers of a lifting jig disposed at a predetermined height, the gripping levers grip and pull the stepped engagement portion, so that the weight of the monocrystal, which until this point has been borne by a pulling wire, is shifted to the lifting jig.

More recently, safer and more practical pulling apparatuses have been developed. In a pulling apparatus disclosed in Japanese Patent Application Laid-Open (kokai) No. 9-2893, a measure is employed to prevent a lifting jig—which holds the stepped engagement portion of a monocrystal—from opening easily, even when a large load acts on the lifting jig, to disperse stresses acting on holding portions that are in contact with the stepped engagement portion, and to prevent contamination of material melt, which contamination would otherwise occur due to particles generated at a sliding portion of the lifting jig or at other portions.

However, the above-described conventional crystal holding apparatus has an unsolved problem as follows. That is, the holding portions of the lifting jig—which portions are actually brought into contact with the surface of the stepped engagement portion of a monocrystal and holds it—has been made of a material having high heat resistance and hardness, such as stainless steel or molybdenum. However, recent studies reveal that when a hard material is used, each of the holding portions contacts a monocrystal via a single point, and therefore stress concentration occurs, with the result that the monocrystal breaks from the contact point even if the applied load is relatively small (approximately 180 kgf). Therefore, if the crystal holding apparatus were used to pull a large monocrystal having a mass of over 180 kg, the monocrystal would fall down during the pulling operation. Even when a monocrystal having a mass of about 100 kg is pulled, there is a large possibility that the monocrystal would fall during pulling operation in consideration of the design safety factor and the brittleness of silicon. Therefore, there has been a strong demand for a measure to solve the above-described problem.

SUMMARY OF THE INVENTION

The present invention has been accomplished to solve the above-mentioned problem, and an object of the present invention is to provide a crystal holding apparatus having an improved lifting jig which prevents the breaking and falling down of a monocrystal during a pulling operation even when the monocrystal is considerably heavy.

In order to achieve the above object, the present invention provides a crystal holding apparatus in which a corrugated portion between a seed crystal and a straight cylindrical portion of a monocrystal is held by holding portions of a lifting jig during a monocrystal growth process wherein the seed crystal is brought into contact with material melt and is subsequently pulled while being rotated. In the crystal holding apparatus, an attachment member for establishing surface contact with the corrugated portion of the monocrystal is attached to the tip end of the holding portion of the lifting jig. The attachment member is preferably formed of a heat-resistant soft material.

In the crystal holding apparatus of the present invention, the attachment members attached to the tip end of the holding portions of the lifting jig increase the contact area with the surface of the corrugated portion of the monocrystal. Also, since the attachment members are formed of a heat-resistant soft material, the attachment members can come into close contact with the surface of the corrugated portion of the monocrystal even at fine uneven portions thereof, thereby mitigating stress concentration. Therefore, a monocrystal can be pulled safely without causing breakage of the monocrystal even when the monocrystal is considerably heavy.

Preferably, the attachment members are formed of a heat-resistant soft material that causes plastic deformation in an amount of about 2 mm when a load of 50 kgf/mm$^2$ is applied to the attachment member. Preferably, the heat-resistant soft material that causes plastic deformation is selected from the group consisting of aluminum, aluminum alloys, carbon, and carbon composites. The heat-resistant soft material preferably can endure a temperature of at least 500° C., more preferably 600° C. or higher.

In the case where the attachment members are formed of a heat-resistant material that causes plastic deformation, when the lifting jig holds the corrugated portion of a monocrystal, the attachment members come into contact with the surface of the corrugated portion even at fine uneven portions, concentration of stresses applied to the monocrystal can be mitigated, and the monocrystal can be pulled safely without causing breakage, which would otherwise occur due to the considerable weight of the monocrystal to be grown.

Alternatively, the attachment members may be formed of a heat-resistant soft material selected from the group consisting of heat resistant rubbers, heat resistant synthetic resins, and heat resistant FRP, or from the group consisting of ceramic wool, ceramic felt, carbon wool, and carbon felt.

When the attachment members are formed of a heat-resistant soft material having elasticity such as heat resistant rubbers, heat resistant synthetic resins, heat resistant FRP, ceramic wool, ceramic felt, carbon wool, and carbon felt, the degree of close contact between the attachment members and the surface of the corrugated portion of a monocrystal increases further, so that the contact area increases. Thus, breakage of the monocrystal can be avoided.

In the case where the attachment members are formed of a heat resistant rubber, heat resistant synthetic resin, or heat resistant FRP, the holding portions of the lifting jig are preferably cooled, and/or preferably shielded from heat radiated from the surface of melt, because the heat resistance of these materials are not very high.

Alternatively, the attachment members may be formed of sand, jelly, or clay packed in a heat resistant bag that is formed of a heat resistant cloth formed of fibers selected from the group consisting of heat-resistant synthetic fibers, glass fibers, ceramic fibers, metal fibers, or composite fibers composed of two of more kinds of fibers selected from the above-described fiber materials. In this case, surface contact between the attachments members and the corrugated portion of the monocrystal becomes more reliable through utilization of the viscosity of the material packed into the bag and flexibility of the cloth forming the bag, so that breakage and falling down of the crystal can be avoided.

Alternatively, the attachment members may be formed of a heat-resistant soft material selected from the group consisting of glass and heat resistant thermoplastic resins, which soften at high temperatures. In this case, when a monocrystal is pulled, the attachment members soften due to a high-temperature atmosphere in the vicinity of the holding portions, which hold the corrugated portion of the monocrystal, and the attachment member fills fine uneven portions of the surface of the corrugated portion of the monocrystal to increase the contact area, thereby enabling safe holding of a heavy monocrystal.

In conventional holding portions formed of a hard material, since the holding portions contact a monocrystal by means of point contact, there is a possibility that the monocrystal will break due to stress concentration. In contrast, in the present invention, since the attachment members formed of a heat-resistant soft material are attached to the tip ends of the holding portions, surface contact can be established between the holder portions and the monocrystal, and therefore concentration of stresses applied to the monocrystal can be mitigated, so that the monocrystal to be grown is prevented from breaking or falling down due to the considerable weight of the monocrystal to be grown. Thus, safe pulling of the monocrystal is enabled.

DESCRIPTION OF THE PREFERRED EMBODIMENTS

Embodiments of the present invention will now be described with reference to the drawings. However, the present invention is not limited thereto.

In order to avoid breakage of a monocrystal at a held portion, which breakage would otherwise occur due to an increase in the weight of the monocrystal during a pulling operation, the inventors of the present invention carried out earnest studies in order to find a measure for dispersing the load acting on the surface of the corrugated portion of a monocrystal and found that such monocrystal breakage can be effectively avoided through a measure in which an attachment member for establishing surface contact is directly attached to the tip end of each holding portion of a lifting jig and the attachment members are formed of a heat-resistant soft material.

First, a description will be given of an example of a crystal holding apparatus of a crystal pulling apparatus to which the present invention is applied.

The crystal holding apparatus of the present invention is suitable for a crystal pulling apparatus which grows a monocrystal of a semiconductor material such as silicon in accordance with, for example, the so-called Czochralski method (CZ method), and is particularly suitable for the safe manufacture of a heavy monocrystal without generation of dislocation.

Figure 1:
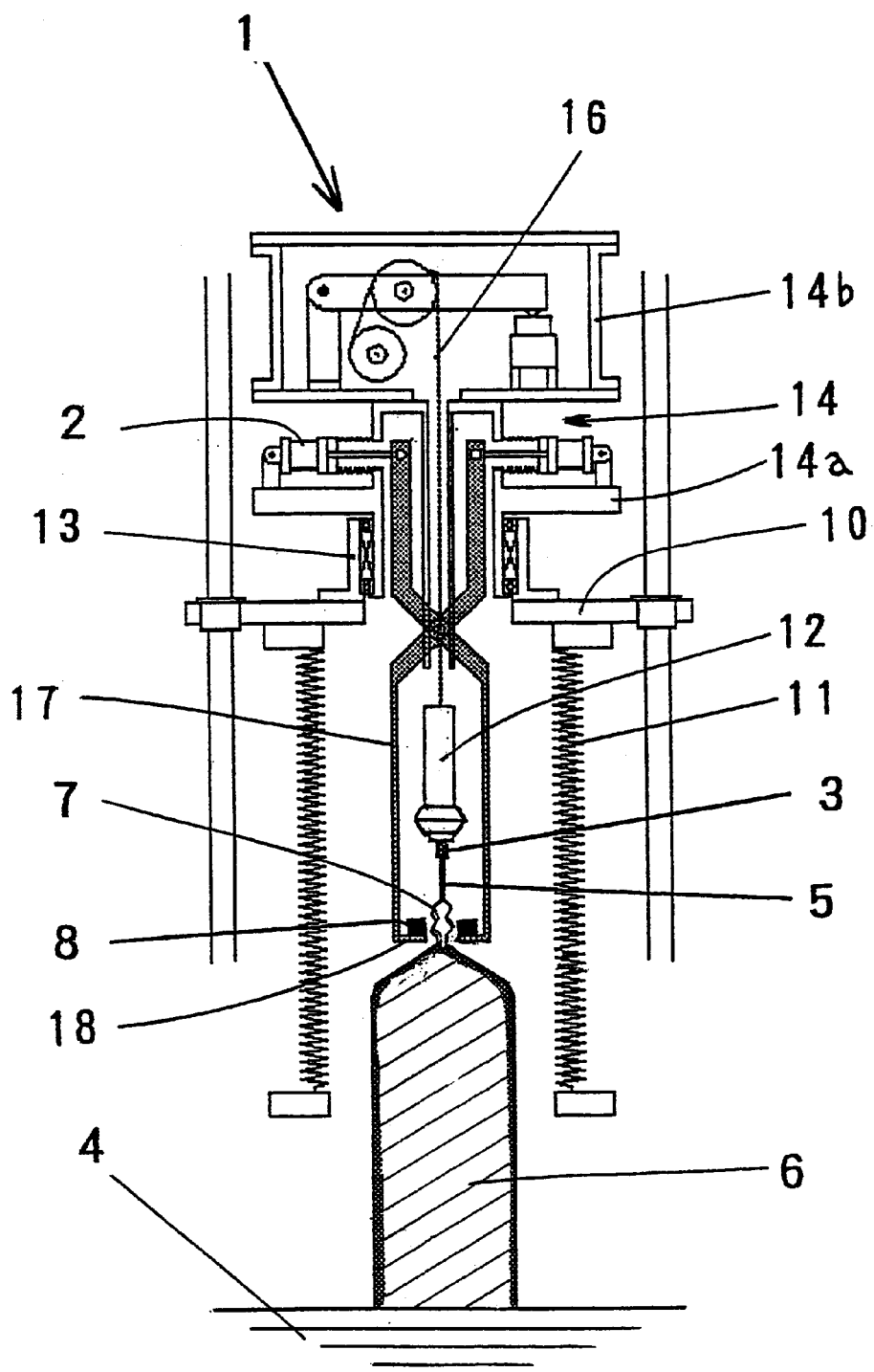
FIG. 1 is an explanatory view showing an example of a crystal holding apparatus of the present invention.

As shown in FIG. 1, such a crystal pulling apparatus includes an unillustrated lower chamber which accommodates an unillustrated crucible containing material melt, a lifting base 10 disposed above the lower chamber with a predetermined clearance present therebetween, and a bellows chamber 11 disposed between the lifting base 10 and the lower chamber. A cylindrical rotary support member 13 is fixed to the upper surface of the lifting base 10, and an accommodation case 14 is disposed inside the rotary support member 13 and is supported thereby via a bearing such that the accommodation case 14 is rotatable about a vertical axis.

The accommodation case 14 is composed of a lower accommodation case 14a and an upper accommodation case 14b integrally joined together. Within the lower accommodation case 14a are disposed an unillustrated rotation mechanism and a lifting jig drive mechanism 2 serving as a part of the crystal holding apparatus 1. Within the upper accommodation case 14b are disposed a wire pulling mechanism and a load measurement mechanism.

A seed chuck 12 for holding a seed crystal 3 is attached to the lower end of a wire 16. After the lower end of the seed crystal 3 is brought into contact with material silicon melt 4 contained in the crucible, the seed crystal is pulled upwardly, while been rotated, in order to grow a monocrystal. That is, a neck portion 5 for making the monocrystal dislocation free is first formed, and a straight cylindrical portion 6 is then formed. At this time, a corrugated portion 7 existing between the neck portion 5 and the straight cylindrical portion 6 is held by holding portions 18 of a lifting jig 17, which is a part of the crystal holding apparatus 1, in order to bring attachment members 8 of the present invention into pressure contact with the surface of the corrugated portion 7, thereby holding and pulling the monocrystal.

In the above-described crystal pulling apparatus, the lifting jig 17 of the crystal holding apparatus is exposed to radiant heat from the material melt 4 located below the crystal holding apparatus 1. Therefore, the pulling operation is performed under conditions that are disadvantageous for a monocrystal to be pulled, in terms of the strength thereof. In addition, when the monocrystal to be pulled has a considerable weight, a large load acts on the tip ends of the holding portions 18. Therefore, there is required a measure for holding a monocrystal in a reliable manner.

Figure 2:
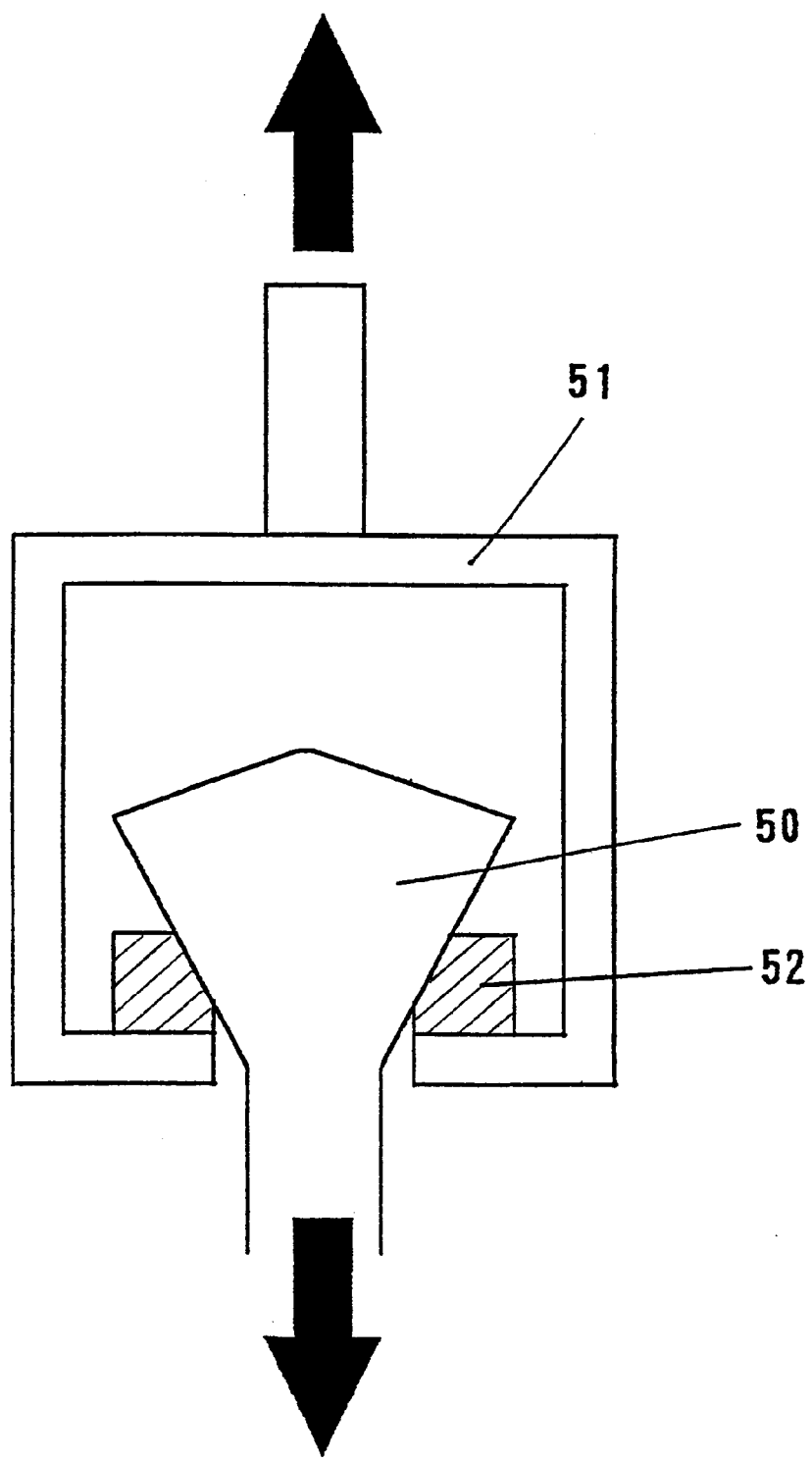
FIG. 2 is an explanatory view showing a tension tester that models the crystal holding apparatus of the present invention.

In view of the foregoing, the present inventors conducted a tensile test that modeled a crystal holding apparatus, in order to find conditions that allow safe and reliable holding of a crystal. In the tensile test, an apparatus as shown in FIG. 2 was used. A test sample 50 was a block of a silicon monocrystal that had been formed in an inverted-cone-shaped head portion and a neck portion in order to model the shape of a head portion of a silicon monocrystalline ingot immediately after pulling. Attachment members 52 formed of one of various materials described below were attached to the tip ends of the sample holding portions of a tensile jig 51 at a location where the sample holding portions come into contact with the monocrystal.

When the attachment members are made of metal aluminum, the strength of the monocrystal at the held portion increases to 350 kgf. Further, various kinds of materials were tested as the material for the attachment members. The test results show that in the case where materials that cause plastic deformation are used, the strength of the monocrystal is maximized when there is used a material that deforms in an amount of approximately 2 mm upon application of a stress of 50 kgf/mm$^2$. When the material of the attachment members is too soft, the surface of the holding portions behind the attachment members are exposed and the exposed portions come into contact with the monocrystal by means of point contact. In this case, stress concentration occurs, and therefore insufficient effect is obtained.

When carbon felt is used for the attachment members, the strength of the monocrystal is increased to 600 kgf or higher. This indicates that the carbon felt is considerably effective as a material for mitigating stress concentration. That is, the load resistance of a monocrystal can be increased through an increase in the contact area between the silicon monocrystal and the holding portions of the pulling jig, so that breakage of monocrystal can be avoided.

Next, a description will be given of the attachment members used in the present invention.

The present invention is a crystal holding apparatus in which a corrugated portion between a seed crystal and a straight cylindrical portion of a monocrystal is held by holding portions of a lifting jig during a monocrystal growing process wherein the seed crystal is brought into contact with material melt and is subsequently pulled while being rotated, and is characterized in that an attachment member for establishing surface directly contact with the surface of the corrugated portion of the monocrystal is attached to the tip end of each holding portion of the lifting jig.

The shape of the attachment members is determined depending on the portion of a monocrystal to be held. In the case where a corrugated portion called a stepped engagement portion is held, each of the attachment members has a semi-cylindrical shape. That is, a cylindrical member that has a predetermined height in order to cover the entire circumference of the corrugated portion is first formed and is then divided into two members. Thus divided members are attached to the tip ends of the right and left holding portions as the attachment members. The attachment members are attached to the tip ends of the holding portions such that the inner circumferential surface of the attachment members projects inward from the tip ends of the holding portions. Thus, the surface of the corrugated portion is prevented from contacting the tip ends of the holing portions even when the attachment members deform due to press-holding of the corrugated portion.

In the present invention, the material of the attachment members was determined to be selected from heat-resistant soft materials in consideration of the temperature of an atmosphere in which the attachment members are used and the results of the above-described tensile test.

A heat-resistant soft material for the attachment members that causes plastic deformation preferably has physical properties such that the material causes plastic deformation, in an amount of about 2 mm, when a load of 50 kgf/mm$^2$ is applied to the attachment member in consideration of the results of the above-described tensile test. Examples of such a material include aluminum, aluminum alloys, carbon, and carbon composites.

Also, a heat-resistant soft material that mitigates stress concentration through elastic deformation can be used as a material for the attachment members. Examples of such a material include heat resistant rubbers, heat resistant synthetic resins, and heat resistant FRP; and ceramic wool, ceramic felt, carbon wool, and carbon felt. The results of the above-described test indicates that among the abovementioned materials, carbon felt provides an excellent cushioning effect. Examples of the heat resistant rubbers include silicone rubber and fluoro rubber. Examples of the heat resistant synthetic resins include silicone resin, fluoro resin, polyimide resin (PI), polyether ether ketone resin (PEEK), and polyether imide resin (PEI). Examples of composite materials called FRP (fiber reinforced plastic) include a glass fiber reinforced PPS, and born fiber reinforced epoxy resin which are manufactured through composition of heat resistant fibers and a heat resistant resin. When the attachment members are formed of a heat resistant soft material having elasticity such as carbon felt, the degree of close contact between the attachment members and the surface of the corrugated portion of a monocrystal increases further, so that the contact area increases. Thus, breakage of the monocrystal can be avoided.

The attachment member may be formed of sand, jelly, or clay packed in a heat resistant bag that is formed of a heat resistant cloth formed of fibers selected from the group consisting of heat-resistant synthetic fibers, glass fibers, ceramic fibers, metal fibers, or composite fibers composed of two of more kinds of fibers selected from the above-describe fiber materials. In this case, the contact surface between the attachments members and the corrugated portion of the monocrystal can be increased through utilization of the viscosity of the material packed into the bag, so that the monocrystal can be held safely.

Moreover, the attachment members may be formed of a heat-resistant soft material selected from the group consisting of glass that softens at high temperatures, and heat resistant thermoplastic resins. In this case, when a monocrystal is pulled, the attachment members soften due to a high-temperature atmosphere in the vicinity of the holding portions—which holds the corrugated portion of the monocrystal, the attachment member fills fine uneven portions of the surface of the corrugated portion of the monocrystal to increase the contact area, thereby enabling safe holding of a heavy monocrystal. Examples of the heat resistant thermoplastic resins include polysulfone resin (PSF) and polyphenylene sulfide resin (PPS).

EXAMPLES

Next, the present invention will be described by way of example. However, the present invention is not limited thereto. Example:

A pulling operation was conducted through use of the CZ-method silicon crystal pulling apparatus shown in FIG. 1 in which semi-cylindrical attachment members 8 formed of carbon fibers were attached to the tip ends of the holding portions 18 for holding the stepped engagement portion 7 of a crystal.

First, solid silicon material placed in the crucible was melted to obtain silicon melt 4, and a seed crystal of silicon monocrystal 3 was dipped into the silicon melt 4. Subsequently, the seed crystal 3 was pulled while being rotated. Thus, a monocrystal was grown below the seed crystal 3. During the growth of the monocrystal, a necked portion was formed (necking portion forming process) in order to grow a dislocation free monocrystal.

Subsequently, a corrugated portion (stepped engagement portion 7) was formed to allow the lifting jig to hold the monocrystal. The pulling speed was then changed such that the diameter of the monocrystal was increased to a target diameter and then maintained constant to form a straight cylindrical portion 6. When the monocrystal was pulled to a predetermined height, the holding portions 18 of the lifting jig 17 are operated to hold the corrugated portion. At this time, the attachment members 8 attached to the tip ends of the holding portions 18 were caused to deform in a proper amount and come into close contact with the surface of the corrugated portion of the monocrystal, so that the lifting jig 17 was able to hold the corrugated portion through a wider area. Subsequently, the monocrystal was pulled by the crystal holding apparatus.

When the corrugated portion of the monocrystal was held by the semi-cylindrical attachment members formed of carbon fibers as described above, the monocrystal can be pulled, while being held safely without breakage, until the length of the monocrystal become a target weight and thus the load acting on the monocrystal reached 300 kgf.

Since the semi-cylindrical attachment members formed of carbon fibers was able to sustain a large load of 600 kg or higher in the above-described tensile test, the attachment members provides a sufficiently large safety factor.

The present invention is not limited to the above-described embodiments. The above-described embodiments are mere examples, and those having the substantially same structure as that described in the appended claims and providing the similar action and effects are included in the scope of the present invention.

For example, the above-describe corrugated portion of a monocrystal may be intentionally formed through adjustment of the pulling rate or the temperature, or may be an uneven portion of the surface of a monocrystal naturally formed during the growth of the monocrystal. Further, the portion to be held may be a cone portion or the upper half of the straight cylindrical portion.

Needless to say, the present invention is applicable to the MCZ method.

What is claimed is:

1. A crystal holding apparatus for holding a monocrystal during a crystal growth process wherein a seed crystal is brought into contact with material melt and is subsequently pulled while being rotated, said crystal holding apparatus comprising:

a lifting jig having holding portions for holding a corrugated portion formed between the seed crystal and a straight cylindrical portion of the monocrystal; and an attachment member attached to the tip end of each holding portion of said lifting jig and adapted to establish surface contact with the corrugated portion of the monocrystal, wherein said attachment member is formed of a heat-resistant soft material.

2. A crystal holding apparatus according to claim 1, wherein said attachment members are formed of a heat-resistant soft material that causes plastic deformation in an amount of about 2 mm when a load of 50 kgf/mm$^2$ is applied to the attachment member.

3. A crystal holding apparatus according to claim 2, wherein said attachment members are formed of a heat-resistant soft material selected from the group consisting of aluminum, aluminum alloys, carbon, and carbon composites.

4. A crystal holding apparatus according to claim 1, wherein said attachment members are formed of a heat-resistant soft material selected from the group consisting of aluminum, aluminum alloys, carbon, and carbon composites.

5. A crystal holding apparatus according to claim 1, wherein said attachment members are formed of a heat-resistant soft material selected from the group consisting of heat resistant rubbers, heat resistant synthetic resins, and heat resistant FRP.

6. A crystal holding apparatus according to claim 1 wherein said attachment members are formed of a heat-resistant soft material selected from the group consisting of ceramic wool, ceramic felt, carbon wool, and carbon felt.

7. A crystal holding apparatus according to claim 1, wherein said attachment members are formed of sand, jelly, or clay packed in a heat resistant bag that is formed of a heat resistant cloth formed of fibers selected from the group consisting of heat-resistant synthetic fibers, glass fibers, ceramic fibers, metal fibers, or composite fibers composed of two of more kinds of fibers selected from the fiber materials.

8. A crystal holding apparatus according to claim 1, wherein said attachment members are formed of a heat-resistant soft material selected from the group consisting of glass and heat resistant thermoplastic resins, which soften at high temperatures.

* * * * *